United States Patent [19]

Cordell

[11] 3,904,989

[45] Sept. 9, 1975

[54] VOLTAGE CONTROLLED EMITTER-COUPLED MULTIVIBRATOR WITH TEMPERATURE COMPENSATION

[75] Inventor: Robert Roger Cordell, New Shrewsbury, N.J.

[73] Assignee: Bell Telephone Laboratories, Incorporated, Murray Hill, N.J.

[22] Filed: Sept. 19, 1974

[21] Appl. No.: 507,569

[52] U.S. Cl............ 331/113 R; 331/34; 331/108 D; 331/176; 331/177 R

[51] Int. Cl.$^2$..................... H03K 1/04; H03K 3/282

[58] Field of Search........ 331/113 R, 108 C, 108 D, 331/176, 177 R, 34

[56] References Cited

UNITED STATES PATENTS

| | | | |
|---|---|---|---|
| 3,419,810 | 12/1968 | Xylander | 330/23 |
| 3,582,809 | 6/1971 | Rigby | 331/113 R X |
| 3,665,343 | 5/1972 | Thompson | 331/177 R X |
| 3,869,679 | 3/1975 | Grebene | 331/34 X |

OTHER PUBLICATIONS

Grebene, A. M., "The Monolithic Phase-Locked Loop–A Versatile Building Block," IEEE Spectrum, March 1971, pp. 38–49.

*Primary Examiner*—Siegfried H. Grimm
*Attorney, Agent, or Firm*—G. E. Murphy

[57] ABSTRACT

A high-speed temperature-compensated integrated circuit voltage-controlled oscillator for use in applications such as phase-locked loops. The oscillator is a nonsaturating emitter-coupled multivibrator wherein temperature compensation is achieved by establishing virtually identical temperature dependency in the current which charges the multivibrator timing capacitor and in the voltage swing which appears across the timing capacitor.

18 Claims, 4 Drawing Figures

VOLTAGE CONTROLLED EMITTER-COUPLED MULTIVIBRATOR WITH TEMPERATURE COMPENSATION

BACKGROUND OF THE INVENTION

This invention pertains to multivibrator circuits, and more particularly to a temperature-compensated voltage-controlled emitter-coupled current circuit which may be used in a high-speed phase-locked loop. at The astable emitter-coupled multivibrator has long been utilized in countless applications as a generator of rectangular-wave signals. In such a multivibrator circuit, the oscillation frequency is determined by the time required to charge the timing capacitor, which couples the emitter circuits, to a first threshold voltage and the time required to discharge this capacitor to a second threshold voltage. Since the charge and discharge times can be controlled by the value of the timing capacitor, by the voltage differences between the two threshold voltages, i.e., the voltage swing across the timing capacitor, and by control of the values of the charging and discharging currents, it has become a well-accepted practice to utilize such an emitter-coupled multivibrator as a variable frequency oscillator. Because of the circuit's high frequency capability, its adaptability for linear voltage-to-frequency conversion, and its amenability to realization as a silicon intergrated circuits, one of these uses has been as a voltage-controlled oscillator in phase-locked systems. It has been widely recognized that the voltage-controlled oscillator is usually the most critical component of a phase-locked loop, since primary system characteristics, such as minimum filtering bandwidth and linearity of FM demodulation, normally are limited by the stability and linearity of the voltage-controlled oscillator. It has been accordingly appreciated that temperature-induced changes in the free-running frequency of the voltage-controlled oscillator present definite operational limitations.

Prior art phase-locked loops have relied on minimizing temperature effects or drift by utilizing additional circuitry whose sole function is to compensate for temperature effects. An example of such an approach is disclosed by A. M. Grebene in an article entitled, "The Monolithic Phase Locked Loop a Versatile Building Block," pages 38–49, *IEEE Spectrum*, March 1971. In the circuit disclosed by Grebene a separate temperature-compensating bias network is utilized to vary the emitter currents of the multivibrator stage and thereby maintain a relatively stable free-running frequency. Although such a circuit can substantially improve operation, temperature compensation of this type has inherent disadvantages. Other than the requirement of additional circuitry, one of the difficulties with such a technique is that a bias compensation network is normally designed to provide compensation for the theoretical average or typical temperature-frequency characteristics and such a technique does not normally provide precise temperature compensation within the constraints imposed by high volume manufacturing.

It is therefore an object of this invention to achieve precise temperature compensation of a nonsaturating emitter-coupled multivibrator without the use of substantial ancillary circuitry.

SUMMARY OF THE INVENTION

This and other objects are achieved in accordance with this invention by establishing an emitter-coupled multivibrator circuit in which the timing capacitor charge and discharge current exhibit a temperatgure dependency virtually identical to the temperature dependency exhibited by the timing capacitor voltage swing. More particularly, in the present invention, a virtually constant multivibrator free-running frequency is obtained over a wide temperature range by:

1. establishing the multivibrator threshold voltages such that the voltage swing across the timing capacitor is directly related to the voltage dropped across a semiconductor junction carrying a reference current which is a predetermined scalar multiple of the timing capacitor charging current; and 2. establishing the multivibrator charging current so that it is in fact generated by the voltage drop of a conducting semiconductor junction which carries this predetermined reference current.

Structurally, the present invention establihses the previously described voltage swing across the timing capacitor by utilizing a nonsaturating active load circuit in the collector circuit of each multivibrator switching transistor and by cross coupling the collectors of the switching transistors with oppositely poled diodes. The multivibrator charging current is generated by a temperature-dependent current source circuit which ensures that each multivibrator bias current, and thus the capacitor charge and discharge currents, is directly related to the voltage across a semiconductor junction which carries the prescribed current. This temperature-dependent current source includes a feedback transistor stage which maintains the voltage across a timing resistor equal to the voltage across the base-emitter junction of a transistor whose collector current is maintained at the prescribed reference current level, and further includes current mirror circuits which are biased by the resulting current through the timing resistor and deliver the required temperature-dependent bias current to the multivibrator emitter circuits.

DETAILED DESCRIPTION

Figure 1B:
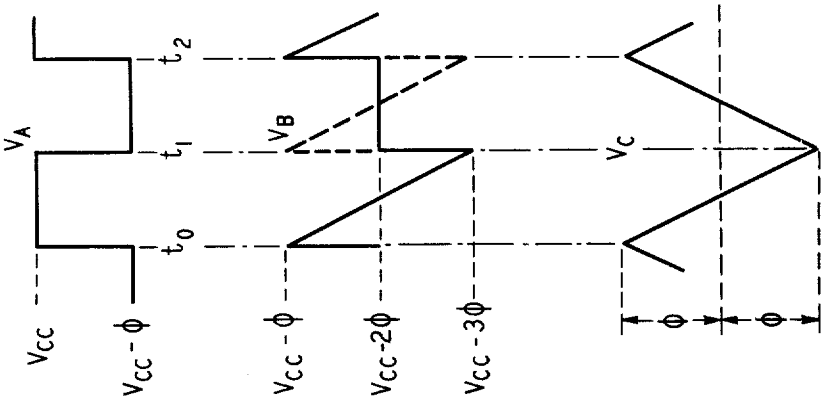
FIGS. 1A and 1B are respectively schematic illustrations of a prior art emitter-coupled multivibrator circuit, and a wave-shaped diagram which is useful in understanding the prior art circuit.
Figure 1A:
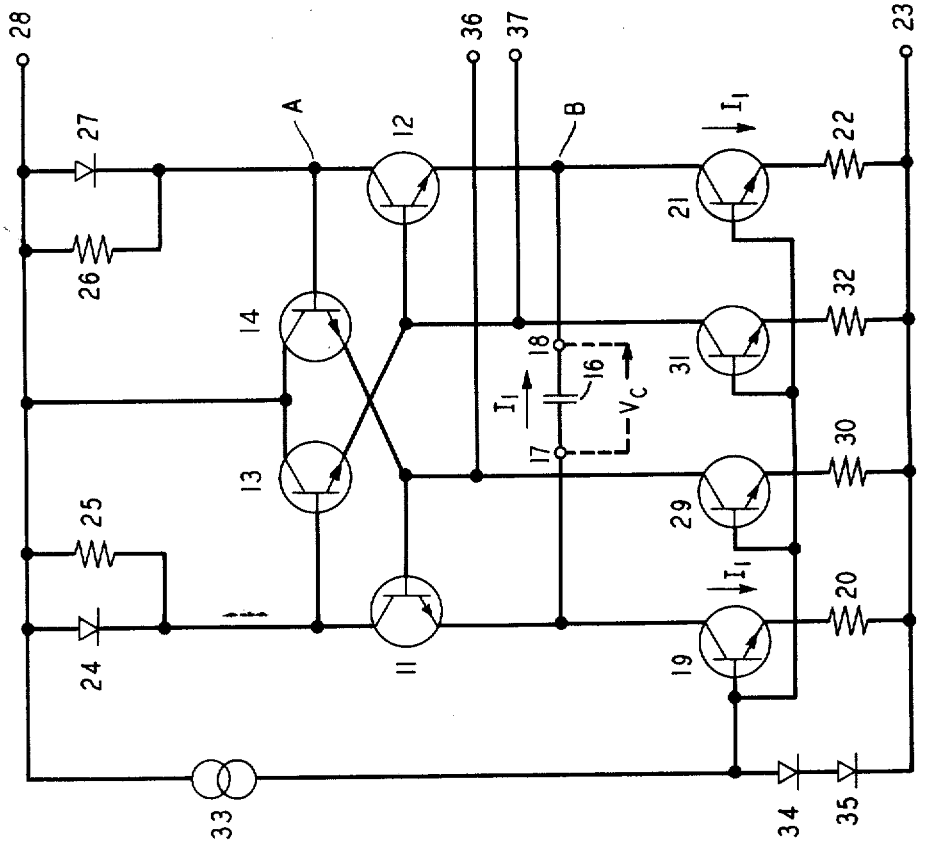
FIG. 1A (PRIOR ART)

FIG. 1A is a prior art emitter-coupled multivibrator of the type commonly employed as a voltage-controlled oscillator in an integrated phase-locked loop circuit. The multivibrator comprises switching transistors 11 and 12 and cross-coupling level-shift transistors 13 and 14 which are respectively connected to transistors 12 and 11. The emitter electrodes of transistors 11 and 12 are coupled together by timing capacitor 16, which is connected between terminals 17 and 18 and is normally a discrete capacitor external to the remaining circuitry, which is generally a silicon integrated circuit. A current source comprising transistor 19 and resistor 20 is connected between the emitter electrode of transistor 11 and bias terminal 23. A current source comprising transistor 21 and resistor 22 is connected between the emitter electrode of tranistor 12 and bias terminal 23. These current sources determine the frequency of the multivibrator output signal and in voltage-controlled oscillator applications additional circuitry, not depicted in FIG. 1A, is utilized to control the currents applied to the emitter circuits of transistors 11 and 12— and thus the frequency of oscillation—in response to an applied control voltage. A current source comprising transistor 29 and resistor 30 and a current source comprising transistor 31 and resistor 32 are respectively connected from the emitter electrodes of transistors 14 and 13 to bias terminal 23. These current sources establish the bias currents of cross-coupling transistors 13 and 14. The base electrodes of current source transistors 19, 21, 29, and 31 are commonly connected to the anode of diode 34. Since diode 34 is series connected with bias current source 33 and diode 35, between bias terminal 28 and ground terminal 23, the base electrodes of current source transistors 19, 21, 29, and 31 are maintained at a voltage effectively two diode drops above the reference potential applied to bias terminal 23. Thus, it will be recognized that the current flow through each current source is substantially equal to the voltage drop of a single diode divided by the value of the resistor used in that particular current source. As will be ascertained in the following circuit description, a symmetrical multivibrator output signal is established between terminals 36 and 37 by establishing equal current through transistors 19 and 21.

The collector load circuit of transistor 11 comprises parallel-connected diode 24 and resistor 25 and the collector load circuit for transistor 12 comprises parallel-connected diode 27 and resistor 26. Diodes 24 and 27, in conjunction with connected transistors 13 and 14, ensure that switching transistors 11 and 12 will not saturate and also establish the magnitude of the output voltage signal.

The operation of the prior art circuit is best understood by referring to the voltage diagram of FIG. 1B and by assuming that one of the switching transistors, say transistor 11, is in a conducting or ON condition (just after time $t_0$). With transistor 11 ON, transistor 12 is necessarily in the nonconducting or OFF state, since the voltage of the base electrode of transistor 12 is substantially $V_{CC}$-2$\phi$and the emitter electrode of transistor 12 is greater than $V_{CC}$-3$\phi$, where $V_{CC}$ is the bias voltage applied to terminal 28 and $\phi$ is the diode drop of any applicable diode or base-to-emitter junction, e.g., in this case, the diode drop of diode 24 and the base-to-emitter drop of transistor 13. For convenience, the equal currents established by the current sources connected to transistors 11 and 12 have been denoted as an arbitrary at $I_1$. Thus, it can be seen that the emitter current of transistor 11 is equal to $2I_1$ and that a current equal to $I_1$ must necessarily flow through timing capacitor 16 in the direction of the arrow shown in FIG. 1A. This constant current causes the voltage across capacitor 16, depicted as $V_C$ in FIG. 1B, to linearly decrease, thereby decreasing the voltage at the emitter of transistor 12 (waveshape $V_B$ of FIG. 1B). At time $t_1$, voltage $V_B$ reaches $V_{CC}$-3$\phi$and, accordingly, transistor 12 then enters a nonsaturating conductive state which, in turn, causes the potential at the base electrode of transistor 14 to decrease to $V_{CC}$-$\phi$. This action simultaneously switches transistor 11 to the OFF state, since the potential switches both the emitter and base electrodes of transistor 11 is substantially equal to $V_{CC}$-2$\phi$. It wil be recognized that at this point in time the emitter current of transistor 12 becomes equal to $2I_1$ and capacitor 16 begins to linearly charge through current source transistor 19. At time $t_2$ the potential at the emitter of transistor 11 reaches $V_{CC}$-3$\phi$ and the circuit reverts to the state in which transistor 11 is conducting and transistor 12 is not conducting.

Although the frequency of oscillation of the prior art circuit of FIG. 1 is often expressed as $$f_o = \frac{I_1}{4\Phi C_{16}} \quad (1)$$

or, since $$I_1 = \phi / R_{20}$$

$$f_o = \frac{1}{4R_{20}C_{16}},$$

it is easily recognizable that several temperature-dependent terms which impart frequency drift have been neglected. For example, the derivation of this expression, like the above description of the prior art circuit, assumes that the voltage drop across all diode and base emitter junctions is equal to a constant voltage $\phi$. It is well known, however, that the voltage drop across a semiconductor junction carrying a current $I_i$ is temperature dependent and is substantially $$\Phi_i = \frac{kT}{q} \ln \left( \frac{I_i}{I_s} \right) \quad (2)$$

where $k$ equals Boltzmann's constant, T equals the junction temperature in degree Kelvin, $q$ equals the electronic charge unit, and $I_s$ equals the saturation current of the diode junction. Since each of the semiconductor junctions within the multivibrator circuit does not carry the same current at the moment switching occurs, it will be recognized that variations in junction voltage drops alone impart significant temperature drift to the prior art multivibrator free-running frequency. In fact, it is noted that the term $\phi$ in the denominator of Equation (1) is not the voltage drop due to a particular semiconductor junction in the circuit of FIG. 1, but is the result of a mathematical summation about a closed circuit path containing a plurality of junctions. Further, it can be noted form FIG. 1 that the current flowing through diode 24 during the period of time that transistor 11 is in conduction is primarily determined by the value of resistor 25. Since silicon diffused resistors commonly employed in integrated circuits have a high initial tolerance, commonly ±20%, and a relatively high temperature coefficient which may typically exceed 2000 parts per million per °C, neither the initial diode current nor its precise variation with temperature can be ascertained. In a like manner, the initial tolerances and temperature coefficients of resistors 20 and 22 impart unpredictable temperature dependency in bias current $I_1$. Thus, it can be recognized that the prior art circuit exhibits a substantial and rather complex temperature drift.

Figure 2:
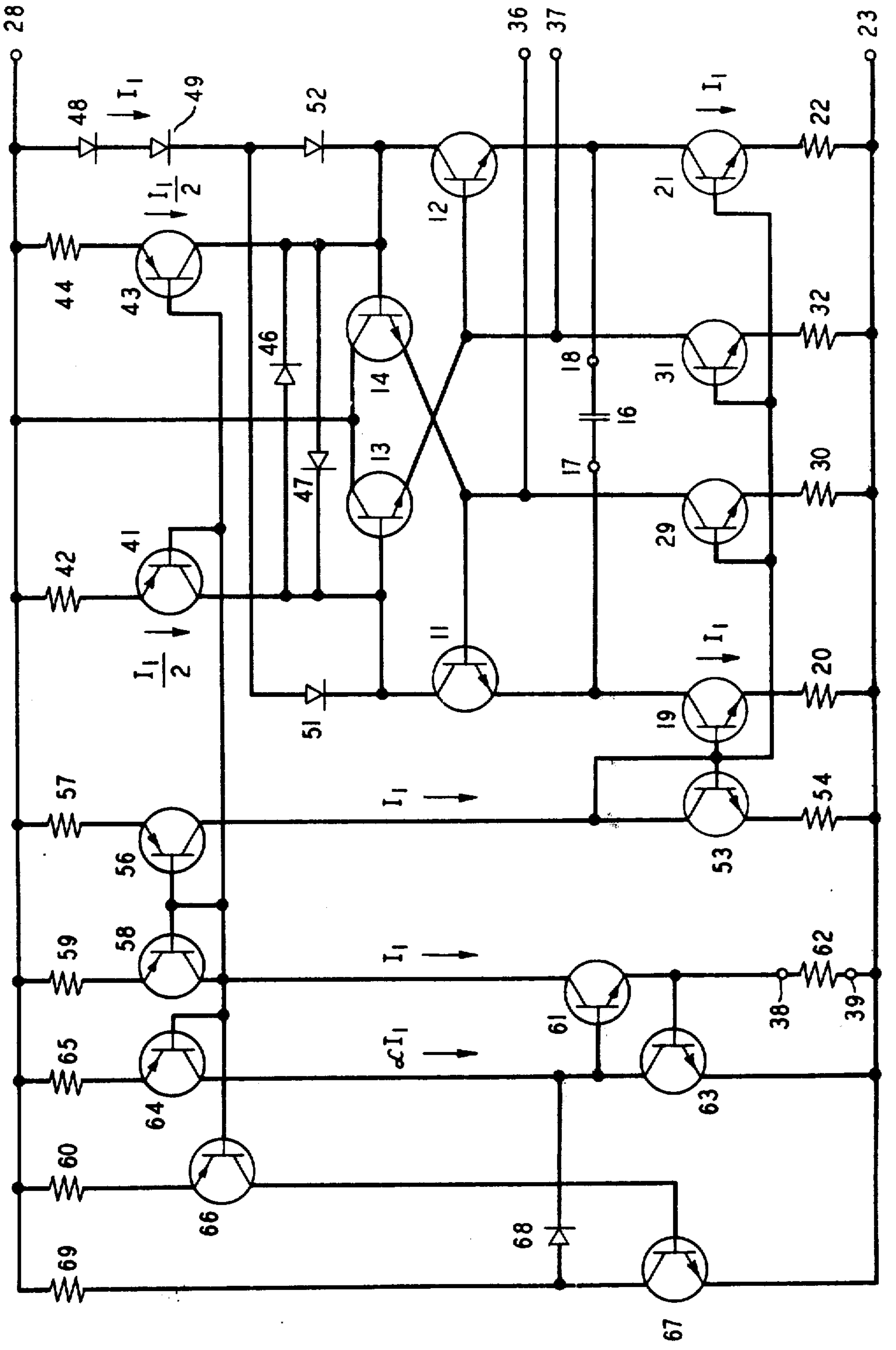
FIG. 2 schematically illustrates a basic embodiment of this invention.

FIG. 2 depicts one embodiment of the present invention which virtually overcomes the prior art temperature limitations without the necessity of a separate temperature compensation network. As will be demonstrated in the following paragraphs, the mathematical expression for the free-running frequency of the circuit structure of FIG. 2 is identical to that of the FIG. 1A prior art circuit. However, the circuit of FIG. 2 establishes identical temperature characteristics in the numerator current term and denominator diode voltage term of Equation (1), thereby ensuring virtually drift-free, or temperature-independent, operation.

In FIG. 2, elements identical to those of FIG. 1A are identically denoted. As in the case of FIG. 1, the circuit means for voltage control of the multivibrator frequency is not depicted. Suitable circuitry is well known to those skilled in the art and a specific circuit, suitable for the practice of the present invention, is included in the embodiment depicted in FIG. 3.

Referring to FIG. 2, the parallel diode-resistor collector load circuits of switching transistors 11 and 12 have respectively been replaced by an active load circuit comprising transistor 41 and resistor 42 and an active load circuit comprising transistor 43 and resistor 44. Each of these active load circuits is a current source which produces a current equal to one-half $I_1$ where, as in FIG. 1, $I_1$ denotes a convenient arbitrary bias current. Oppositely poled diodes 46 and 47 are connected in parallel between the collector of transistor 11 and the collector of transistor 12. These diodes limit the output voltage to an excursion of substantially one diode drop and additionally provide current paths for the switching transistor active load circuits such that the active load current of that switching transistor in the OFF state is rounted through the switching transistor which is in the ON state. Diodes 48, 49, and 52 are series connected between the collector of transistor 12 and bias terminal 28, and diode 51 is connected between the junction of diodes 49 and 52 and the collector of transistor 11. Diodes 48 and 49 ensure sufficient collector-to-emitter bias for proper operation of the active load circuits, whereas diodes 51 and 52 establish collector voltage swings of transistors 11 and 12 and also provide a current path to the collector electrodes of switching transistors 11 and 12.

The base electrodes of current source transistors 19, 21, 29, and 31 are connected to the effective anode of diode-connected transistor 53. Diode-connected transistor 53 is connected in series with resistor 54, with the collector-to-emitter path of transistor 56, and with resistor 57, between bias terminals 28 and 23. The combination of transistors 19, 21, 29, and 31, diode-connected transistor 53, and associated resistors 20, 22, 30, 32, and 54 forms a plurality of current sources which is commonly known as a current mirror. The expression "current mirror" functionally describes the operation of the current sources, since it may be observed that the voltage drop across each of the current-source emitter resistors, e.g., resistor 20, 22, 30, and 32, is substantially equal to the voltage across resistor 54. Accordingly, the current through diode-connected transistor 53 is mirrored or repeated by those current-source transistors which utilize a resistor of the same resistance value as resistor 54. In the circit of FIG. 2, resistors 20 and 22 are normally established equal to resistor 54, and resistors 30 and 32 are generally equal to one another but of higher resistance value than resistor 54.

Examining FIG. 2, it may be seen that the circuit embodiment includes two current mirrors, the previously described NPN current mirror which determines the multivibrator emitter currents and a PNP current mirror which includes the multivibrator active load circuits, and three current sources comprising transistors 56, 64, and 66 and resistors 57, 65, and 60. It will be noted that the current source comprising transistor 56 and resistor 57 is serially connected to diode-connected transistor 53 and resistor 54. Thus, the PNP and NPN current mirrors are effectively locked together, that is, any variation in the current of the PNP mirror is reflected in a proportionate current change in the NPN current mirror. Accordingly, it can be realized that the current which flows through diode-connected transistor 58 and the collector-emitter path of transistor 61 is effectively a control current which establishes the current of each current source in both the NPN and PNP current mirrors. In the circuit of FIG. 2, this control current is generated by a temperature-dependent current source which includes transistors 61, 63, and 64 and resistors 59, 62, and 65. Transistor 64 and resistor 65 form a current source which is a part of the previously described PNP current mirror and is connected between bias terminal 28 and the collector of transistor 63. Transistors 63 and 61 are connected in a shunt feedback configuration with the collector of transistor 63 connected to the base electrode of transistor 61 and the base of transistor 63 is connected to the emitter electrode of transistor 61. Since the emitter electrode of transistor 63 is connected to bias terminal 23 and the emitter electrode of transistor 61 is conected to bias terminal 23 through resistor 62, which is normally a discrete resistor connected to the integrated circuit between terminals 38 and 39, the voltage across resistor 62 is substantially equal to the voltage dropped across the base-emitter junction of transistor 63. Hence, the collector current of transistor 61, which is a control current for both the NPN and PNP current mirrors, is equal to $\phi_{63}/R_{62}$, where $\phi_{63}$ is the voltage dropped across the base-emitter junction of transistor 63 when it carries a current equal to $\alpha I_1$, where $\alpha$ is a scalar factor which, as demonstrated in the following description of the circuit operation, is established to ensure a drift-free multivibrator frequency.

Transistors 66 and 67, diode 68, and resistors 60 and 69 comprise a start-up circuit which ensures that transistors 63 and 61 will establish the proper bias condition when power is initially applied to the oscillator circuit. When the circuit is initially powered, current flows into the base of transistor 61 through resistor 69 and diode 68 which are connected in series between bias terminal 28 and the commonly connected base of transistor 61 and collector of transistor 63. The current source comprising transistor 66 and resistor 60 is a member of the PNP current mirror and is connected to the base electrode of transistor 67. Since the emitter electrode of transistor 67 is connected to bias terminal 23 and the value of resistor 60 is established such that the resulting current will saturate transistor 67, diode 68 rapidly becomes reverse biased and the start-up current ceases to flow into the bias network. Although any circuit which supplies adequate current to the commonly connected base of transistor 61 and collector of transistor 63 will suffice, a start-up circuit of the type depicted in FIG. 2 is advantageous in that it supplies current only during a short period of time immediately after the oscillator circuit is initially powered. Thus, additional current which could effect temperature drift is avoided.

The manner in which the circuit of FIG. 2 eliminates the temperature drift problem of the prior art may be understood by referring to FIG. 2 and comparing the operation of the circuit with the operation of the piror art circuit of FIG. 1. Since the current sources connected to the emitter electrodes of switching transistors 11 and 12 each establish a current $I_1$, it can be recognized that the multivibrator of FIG. 2 resembles the prior art in that capacitor 16 will be linearly discharged and charged by a current equal to $I_1$. In the circuit of FIG. 2, however, it can be noted that the current which flows through the conducting switching transistor is controlled in a substantially precise manner, that is, assuming that transistor 11 is ON and transistor 12 is OFF, the emitter current of transistor 11 is comprised of the sum of the currents flowing in the active load circuits and the current flowing through series-connected diodes 48, 49, and 51. In the circuit of FIG. 2, the resistance values of resistors 42 and 44 are established such that a current equal to $I_1/2$ flows directly into the collector electrode of transistor 11 from transistor 41 and a current equal to $I_1/2$ flows into the collector electrode of transistor 11 from transistor 43 through clamp diode 47. The remaining current of $I_1$, necessary to obtain a total collector current of $2I_1$, thus flows through diodes 48, 49, and 51.

It can be recognized upon understanding the following equations, which mathematically describe the operation of the circuit of FIG. 2, that active load currents other than $I_1/2$ can be established without departing from the scope and spirit of this invention. It can be further recognized from the following equations that the active load current utilized determines the voltage swing across timing capacitor 16, and thus establishes the temperature-dependent reference current level which is necessary to impart drift-free operation to the circuit free-running frequency.

Using the $I_1/2$ active load current level depicted in FIG. 2, it can be observed that during the time interval in which the circuit is in transition from the state in which transistor 11 is ON to the state in which transistor 12 is ON, the following relationships exist:

$$I_{47} = \tfrac{1}{2} I_1 - I_{12} \qquad (3)$$

$$I_{11} = 2 I_1 - I_{12}$$

where each subscript denotes a circuit element of FIG. 2, e.g., $I_{47}$ represents the current through diode 47. Since the circuit will change states when the multivibrator loop gain is substantially equal to unity, it can be shown that, at the instant of switching, $$I_{47} (I_{11} + I_{12}) = I_{11} I_{12} \qquad (4)$$

Combining the current relationships of Equations (3) and (4) yields a quadratic equation having the solution $$I_{12} = (2 - \sqrt{3}) I_1$$

Thus, at the instant of switching, $$I_{12} \approx 0.27 I_1$$

$$I_{47} \approx 0.23 I_1$$

$$I_{11} \approx 1.73 I_1$$

Since, at the moment switching occurs, the voltage across timing capacitor 16 is $$V_{C16} = \phi_{12} - \phi_{11} + \phi_{47},$$

it can be shown by utilizing the previously expressed current relationships and the diode voltage relationship expressed in Equation (2) that $$V_{C16} = \frac{kT}{q} \ln \left[ \frac{0.0359\, I_1}{I_s} \right]$$

which can be recognized to be identically equal to the voltage dropped across a diode which carries a current equal to $0.0359\, I_1$. Thus, recognizing that $V_{C16}$ is equivalent to the $\phi$ term in the denominator of Equation (1), it can be seen that the free-running frequency of the FIG. 2 circuit is virtually temperature independent when the multiplicative factor $\alpha$ of FIG. 2 is equal to 0.0359. That is, the free-running frequency, $f_o$, for the circuit of FIG. 2 is $$f_o = \left\{ \frac{kT}{q} \ln \left[ \frac{0.0359\, I_1}{I_s} \right] \Big/ R_{62} \right\} \Big/ \left\{ 4\, C_{16} \left( \frac{kT}{q} \ln \left[ \frac{0.0359\, I_1}{I_s} \right] \right) \right\}$$

and if the appropriate junction saturation currents are equal, $$f_o = \frac{1}{4 R_{62} C_{16}}, \qquad (5)$$

for all temperatures. Thus, in the present invention, the temperature drift is primarily dependent only on the temperature coefficients of resistor 62 and capacitor 16. Accordingly, it is advantageous to select these external components such that the temperature coefficient of the resistor and capacitor are equal in magnitude and opposite in polarity. It can therefore be recognized that resistor 62 and capacitor 16 can advantageously be selected to precisely establish the desired free-running frequency and simultaneously maintain low frequency drift.

Figure 3:
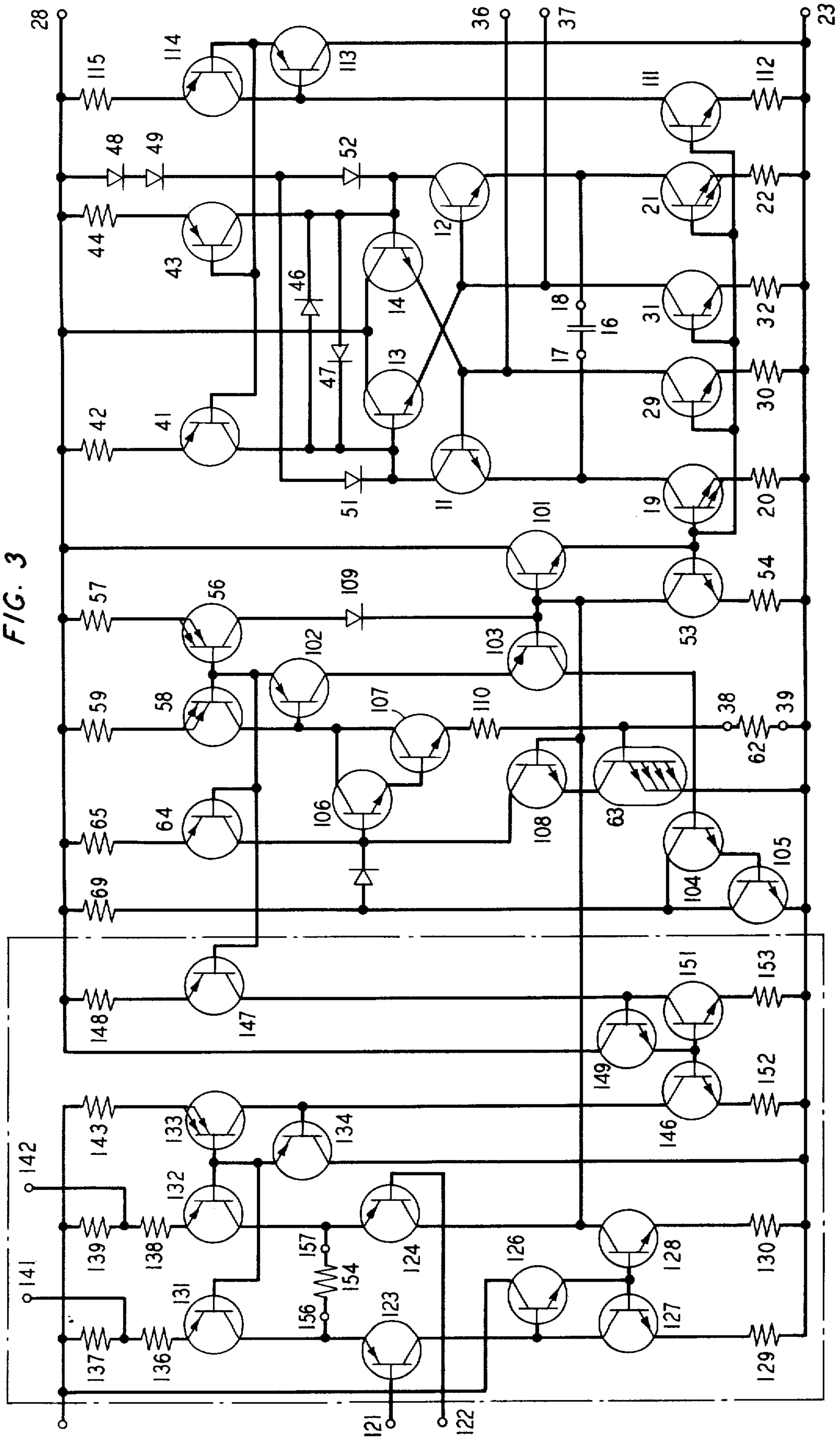
FIG. 3 depicts a second embodiment of the present invention which includes a voltage-controlled frequency provision and circuitry to further minimize temperature-induced frequency drift.

FIG. 3 schematically depicts an embodiment of the present invention which includes voltage control means for linearly varying the frequency of the multivibrator in response to an applied voltage and further includes certain circuit refinements which enhance the temperature performance. In FIG. 3, elements identical to elements of FIGS. 1 and 2 are identified by the same identifiers used in FIGS. 1 and 2.

Basically, the circuit refinements of FIG. 3 are directed toward reducing temperature-induced base current variations which may occur due to temperature-induced variations in transistor betas. Structurally, two techniques are employed, the reduction of transistor base current by utilizing Darlington connected transistors, and the addition of circuitry to extract or inject a temperature-dependent current substantially equal to a deleterious base current.

In the circuit of FIG. 3, effective Darlington circuits are established in several instances. For example, transistors 101 and 102 have been added respectively to the input circuits of the NPN and PNP current mirrors to form an effective Darlington connection and thereby reduce the amount of current removed from the respective current mirror reference or bias current. In the case of the NPN current mirror, the emitter of transistor 101 is connected to the commonly connected base electrodes of the current source transistors, e.g., transistors 19, 21, 29, and 31. The collector electrode is connected to positive bias terminal 28 and the base electrode is connected to the collector of transistor 53. It will be noted that transistor 53 is no longer diode-connected as it was in the circuit of FIG. 2, but now functions as a transistor with the collector to base bias equal to the base emitter potential of transistor 101. This connection does change the basic operation of the current mirror, since the emitter current of transistor 53 serves as the current mirror reference or bias current. Transistor 102 is connected to the PNP current mirror in an analogous manner with its base electrode connected to the collector of transistor 58, its collector electrode connected to negative bias terminal 23 via common base transistor 103 and the base to emitter junctions of the Darlington connected transistors 104 and 105, and its emitter electrode connected to the commonly connected base electrodes of PNP current mirror current source transistors 56, 64, and 147.

Transistor 103 is especially advantageous in circuit embodiments wherein the PNP transistors are integrated as laterally diffused transistors which exhibit much lower betas than conventional vertically diffused transistors. With lower betas, the PNP current mirror requires a relatively high total base current which accordingly results in a larger error in the current mirror current source currents. Transistor 103 compensates for this higher base current by injecting a current substantially equal to this input error current of the PNP current mirror, that is, the base current of transistor 102, into the output of the PNP current mirror at the base of transistor 101.

Transistor 67 of the start-up circuit of FIG. 2 has been replaced by Darlington connected transistors 104 and 105 to minimize the current required to maintain the start-up circuit in saturation after the current mirrors have established the proper operating currents. It can be noted that the base current for transistors 104 and 105 is not supplied form a separate current source in the PNP current mirror as was the case in FIG. 2, but is now supplied by common base transistor 103. Feedback transistor 61 of FIG. 2 has been replaced by Darlington connected transistors 106 and 107, which minimizes the amount of current extracted from the collector current of transistor 63.

Transistor 108 is connected in a common base configuration with its emitter electrode connected to the collector electrode of transistor 63, its base electrode connected to the base electrodes of transistors 101 and 103, and its collector electrode connected to the base electrode of transistor 106. Transistor 108 compensates for the bias current error introduced by the base current of transistor 63 by extracting a base current substantially equal to the base current of transistor 63 from the input current of the NPN current mirror, that is, the base of transistor 101.

Diode 109 connected between the collector electrode of transistor 56 and the commonly connected base electrodes of transistors 101 and 103 tends to equalize the collector-to-base voltages in the PNP current mirror transistors 55 and 58 and in the NPN current mirror transistors 19, 21, and 53. The equal collector-to-base voltages improve the operation of the current mirrors by maintaining substantially equal betas in each of the transistors whose currents directly affect the multivibrator free-running frequency.

It will also be noted in the circuit of FIG. 3 that the multivibrator active load transistors 41 and 43 are not connected as a portion of the PNP current mirror as they were in the circuit of FIG. 2. It has been found advantageous to connect transistors 41 and 43 as a second PNP current mirror which is biased by the NPN current mirror. As will be seen upon understanding the voltage control circuit, this ensures that current variations which occur when the multivibrator frequency is undergoing modulation are reflected in both the multivibrator collector and emitter currents. In FIG. 3 this second PNP current mirror is realized by adding a current source comprising transistor 111 and resistor 112 to the NPN current mirror. This current source provides the bias current to the input of the active load current mirror which comprises transistors 113 and 114 and resistor 115. The input of the active load current mirror is connected in the same manner as the first PNP current mirror, with transistor 113 providing an effective Darlington input connection and transistor 114 and resistor 115 establishing the potential which biases the active load current sources.

In the practive of this invention, it has been found advantageous to scale the emitter currents and emitter areas of certain transistors. For example, in the circuit of FIG. 3, if the multivibrator current $I_1$ is to be 500 microamperes, the reference current which flows through the base-emitter junction of transistor 63 would normally be 17.95 microamperes, a current level which is not readily generated with a high degree of accuracy. By utilizing a multiple emitter device such as transistor 63 of FIG. 3, which has an emitter area four times greater than the transistors generally used in the circuit, the reference current level is increased by a factor of 4 to 71.8 microamperes, while maintaining the same current density as would occur in the absence of emitter scaling.

In the circuit of FIG. 3, emitter scaling is also employed within the PNP and the NPN current mirrors. The emitter areas of transistors 56 and 58 of the PNP current mirror and the resistance values of associated resistors 59 and 57 are scaled over the emitter area of transistor 64 and the resistance value of associated emitter resistor 65, and the emitter areas of transistors 19 and 21 and the resistance values of associated emitter resistors 20 and 22 are scaled over the emitter areas and emitter resistances of the remaining current sources of the NPN current mirror, e.g., transistor 111 and resistor 112. This scaling establishes the necessary relationship between multivibrator current level $I_1$ and the reference current which flows through the base-emitter junction of transistor 63. For example, in the previously mentioned embodiment which utilizes a multivibrator current $I_1$ equal to 500 microamperes and a reference current equal to 71.8 microamperes, resistors 57 and 59 were approximately 3.5 times lower in resistance value in order to establish the collector currents of transistors 56 and 58 equal to 250 microamperes. The emitter areas of transistors 56 and 58 were twice the emitter areas of the remaining PNP current mirror current source transistors, which, although not the same scaling factor as the current or emitter resistance scaling, has been found to provide satisfactory performance. The resistance of emitter resistors 20 and 22 was established equal to one-half the resistance of the remaining NPN current mirror current sources and the emitter areas of transistors 19 and 21 were twice that of the other NPN current mirror source transistors. This scaling provided the desired 500 microampere current sources in the emitter circuits of switching transistors 11 and 12. It should be noted that operation of the current mirrors at a 250 microampere level with current-doubling to 500 microamperes in the switching transistor emitter circuits effects a corresponding doubling of the multivibrator free-running frequency. That is, the frequency of such a circuit is twice that of Equation (5), or $$f_o = \frac{1}{2R_{82}C_{16}}$$

The portion of the circuit of FIG. 3 contained within dashed outline 120 is a differential voltage-to-current converter which provides voltage-controlled frequency operation of the multivibrator circuit by injecting a voltage-controlled current into the NPN current mirror. The voltage control signal is applied to differential input terminals 121 and 122, which are respectively connected to the base electrodes of transistors 123 and 124. The active collector load circuits are formed by the current mirror connection of transistors 126, 127, and 128. The collector electrode of transistor 123 is commonly connected to the base electrode of transistor 126 and the collector electrode of transistor 127; the collector electrode of transistor 124 is connected to the collector electrode of transistor 128; the emitter electrodes of transistors 127 and 128 are respectively connected by resistors 129 and 130 to bias terminal 23; the collector of transistor 126 is connected to bias terminal 28; and the emitter electrode of transistor 126 is connected to the commonly connected bases of transistors 127 and 128. The converter output signal current is taken at the collector of transistor 124, which is connected to the multivibrator NPN current mirror at the base electrode of transistor 101. Resistor 154, which is normally a discrete resistor connected between terminals 156 and 157, establishes the control voltage-to-frequency deviation factor.

The emitter currents of transistors 123 and 124 are established by a PNP current mirror comprising transistors 131, 132, 133, and 134. A current source, which includes transistor 131 and series-connected emitter resistors 136 and 137, is connected to the emitter of transistor 123, and a current source, which includes transistor 132 and series-connected emitter resistors 138 and 139, is connected to the emitter electrode of transistor 124. The use of series-connected emitter resistors 136, 137, 138, and 139 with the junction of resistors 136 and 137 connected to terminal 141 and the junction of resistors 138 and 139 connected to terminal 142 permits the installation of optional connections, external to the integrated circuit embodiment, between terminals 141 and 142 and bias terminal 28 to increase the current level of the two emitter current sources and thereby increase the maximum voltage-controlled frequency deviation. The base electrodes of emitter current source transistors 131 and 132 are both connected to the commonly connected emitter of transistor 134 and base electrode of transistor 133. The emitter of transistor 133 is connected to bias terminal 28 by resistor 143; the collector of transistor 134 is connected to bias terminal 23; and the commonly connected collector of transistor 133 and base of transistor 134 are connected to the collector of transistor 146 which is a current source transistor in an NPN current mirror circuit which links the PNP current mirror of the voltage-to-current converter to the PNP current mirror of the multivibrator. These current mirrors are linked by means of transistor 147 and associated emitter resistor 148 which are connected as a part of the PNP current mirror comprising transistors 56, 58, 64, and 102. The collector of transistor 147 is connected to the collector of transistor 151 and to the base of transistor 149 which is the input of the voltage-to-current converter NPN current mirror. The collector of transistor 149 is connected to bias terminal 28, and the emitter of transistor 149 is connected to the commonly connected base electrodes of current source transistors 146 and 151. Resistors 152 and 153 respectively are connected from the emitter electrodes of transistors 146 and 151 to bias terminal 23.

What is claimed is:

1. A temperature-compensated emitter-coupled multivibrator comprising:

first and second transistors having an emitter electrode, a collector electrode, and a base electrode;

a timing capacitor connected between said emitter electrodes of said first and second transistors;

first and second current sources respectively connected between said first transistor emitter electrode and a terminal of fixed potential and between said second transistor emitter electrode and said terminal of fixed potential, the current produced by said first and second current sources controlled by a reference voltage;

mens for controlling the collector currents of said first and second transistors so that said multivibrator changes states when the voltage across said timing capacitor substantially equals the junction voltage of a semiconductor junction carrying a current which is a predetermined multiple of the current produced by said first and second current sources; and means for generating said reference voltage of said first and second current sources such that said reference voltage is substantially equal to said junction voltage of said semiconductor junction.

2. The multivibrator circuit of claim 1 further comprising voltage control means connected to said emitter electrodes of said first and second transistors to alter the emitter currents in response to an applied voltage and thereby change the oscillation frequency of said emitter-coupled multivibrator.

3. In an emitter-coupled multivibrator circuit including first and second switching transistors, a timing capacitor connected between the emitter electrodes of said first and second switching transistors, and first and second current sources of substantially equal current magnitude respectively connected to said emitter electrodes of said first and second swtiching transistor, the improvement comprising:

means for ensuring said multivibrator circuit changes states when said timing capacitor reaches a predetermined voltage including first and second active load means respectively connected to the collector electrodes of said first and second switching transistors, each of said active load circuits being substantially a current source of a predetermined current magnitude, first and second diodes connected in parallel between the collector electrodes of said first and second switching transistors, and circuit means connected to the collector electrodes of said first and second transistors for supplying a current substantially equal to the difference between the sum of said currents in said first and second current sources and the sum of said currents in said first and second active load means; and means for maintaining the temperature induced current variations of said first and second current sources and said first and second active load circuits substantially proportional to the temperature-induced voltage variations of a semiconductor junction carrying a second prescribed current.

4. In an emitter-coupled multivibrator circuit including first and second transistors, a timing capacitor connected between the emitter electrodes of said first and second transistors, and first and second current sources respectively connected to the emitter electrodes of said first and second transistors, each of said current sources generating a first predetermined current in response to a control current, the improvement comprising:

means for developing said control current of said first and second current sources including a semiconductor junction carrying a current substantially equal to a fractional part of said first predetermined current of said first and second current source, said current developing means further including circuitry for developing said control current as a temperature dependent current which is proportional to the voltage across said semiconductor junction; and means for establishing the switching thresholds of said first and second transistors so that the voltage swing developed across said timing capacitor is directly related to said reference voltage developed across said semiconductor junction.

5. The multivibrator circuit of claim 4 wherein said means for establishing said voltage swing across said timing capacitor includes first and second active load circuits respectively connected to the collector electrodes of said first and second transistors, each of said first and second active load circuits generating a current substantially equal to a fractional portion of said predetermined current of said first and second current sources, said means for establishing said voltage swing across said timing capacitor further including first and second diodes connected in parallel with opposite poling between the collector electrodes of said first and second transistors, and third, fourth, fifth, and sixth diodes, said third, fourth, and fifth diodes respectively series connected with like poling between a first terminal of fixed potential and the collector of said second transistor, said sixth diode connected between the collector of said first transistor and the junction of said fourth and fifth diode.

6. The multivibrator circuit of claim 5 wherein said means for generating said control signal of said first and second current sources includes a third and fourth transistor, the collector electrode of said third transistor connected to the base electrode of said fourth transistor, the emitter electrode of said third transistor connected to a second terminal of fixed potential, the base electrode of said third transistor connected to the emitter electrode of said fourth transistor, said means for generating said control signal further including a resistor connected between said second terminal of fixed potential and said emitter electrode of said fourth transistor, means for establishing the collector current of said third transistor substantially equal to said fractional part of said first predetermined current, and means for utilizing the current flow through said resistor as said control signal.

7. A temperature-compensated integrated circuit emitter-coupled multivibrator comprising:

first, second, third, and fourth transistors each having a base electrode, an emitter electrode, and a collector electrode, said collector electrodes of said first and second transistors respectively connected to said base electrodes of said third and fourth transistors, said base electrodes of said first and second transistors respectively connected to said emitter electrodes of said fourth and third transistors, and said collector electodes of said third and fourth transistors commonly connected to a first terminal of fixed potential;

first, second, third, and fourth current sources, each of said current sources generating a predetermined current in response to a first control current, said first, second, third, and fourth current sources respectively connected between a second terminal of fixed potential and said emitter electrodes of said first, second, third, and fourth transistors;

a first capacitor connected between said emitter electrodes of said first and second transistors;

first and second active load circuits respectively connected between said first terminal of fixed potential and said collector electrodes of said first and second transistors, each of said active load circuits establishing a predetermined current in response to a second control circuit;

first and second diodes connected in parallel, oppositely poled between said collector electrodes of said first and second transistors;

means for supplying a current to said collector electrodes of said first and second transistors substantially equal to the difference between the sum of said predetermined currents of said first and second current sources and the sum of said predetermined currents of said first and second active load circuits;

temperature-dependent voltage source means for producing a reference voltage substantially equal to the junction voltage of a diode carrying a current substantially equal to a predetermined multiplier times the predetermined current of said first current source; and means responsive to said temperature-dependent reference voltage for producing said first and second control currents.

8. The temperature-compensated emitter-coupled multivibrator of claim 7 wherein the magnitude of said predetermined current of said first current source equals the magnitude of said predetermined current of said second current source, the magnitude of each of said predetermined currents of said first and second active load circuits equals one-half said magnitude of said first current source current, and said predetermined multiplier of said temperature-dependent voltage source substantially equals 0.0359.

9. The temperature-compensated multivibrator circuit of claim 8 further comprising a voltage-to-current converter for varying the emitter currents of said first and second transistors from the predetermined levels established by said first and second current sources to thereby control the frequency of said temperature-compensated multivibrator.

10. An integrated emitter-coupled multivibrator circuit comprising:

first, second, third, and fourth transistors each having an emitter electrode, a collector electrode and a base electrode, said collector electrodes of said first and second transistors respectively connected to said base electrodes of said third and fourth transistors, said base electrodes of said first and second transistors respectively connected to emitter electrodes of said fourth and third transistors, and said collector electrodes of said third and fourth transistor connected to a first terminal of fixed potential;

first and second terminals respectively connected to said first and second transistor emitter electrodes for externally connecting a timing capacitor between said emitter terminals of said first and second transistors;

an NPN current mirror circuit including fifth, sixth, seventh, eighth, and ninth transistors having a base electrode, an emitter electrode, and a collector electrode, said collector electrodes of said fifth, sixth, seventh, and eighth transistors respectively connected to said emitter electrodes of said first, second, third, and fourth transistors, said base electrodes of said fifth, sixth, seventh, and eighth transistors commonly connected to the base and collector electrodes of said ninth transistor and said emitter electrodes of said fifth, sixth, seventh, eighth, and ninth transistors respectively connected to a second terminal of fixed potential by first, second, third, fourth, and fifth resistors;

tenth and eleventh transistors having a base electrode, an emitter electrode and a collector electrode, said collector electrodes of said tenth and eleventh transistors respectively connected to the collector electrodes of said first and second transistors, said emitter electrodes of said tenth and eleventh transistors respectively connected to said first terminal of fixed potential by sixth and seventh resistors, said base electrodes of said tenth and eleventh transistors commonly connected;

first and second opposite poled diodes connected in parallel with one another between said collector electrodes of said first and second transistor;

third, fourth, and fifth like-poled diodes respectively series connected between said first terminal of fixed potential and said collector electrode of said second transistor;

a sixth diode connected between the junction of said fourth and fifth diodes and said collector electrode of said first transitor; and a temperature-dependent current source including twelfth, thirteenth, fourteenth, fifteenth, and sixteenth transistors having a base electrode, a collector electrode an an emitter electrode, the base electrode of said twelfth transistor connected to the emitter electrode of said thirteenth transistor, the collector electrode of said twelfth transistor commonly connected to said base electrode of said thirteenth transistor and said collector electrode of said fourteenth transistor, the emitter electrode of said twelfth transistor connected to said second terminal of fixed potential, said collector electrode of said thirteenth transistor commonly connected to the base electrodes of said fourteenth, fifteenth, and sixteenth transistors, said collector electrode of said thirteenth transistor further connected to the collector electrode of said sixteenth transistor and to the commonly connected base electrodes of said tenth and eleventh transistors, said collector electrode of said fifteenth transistor connected to the collector electrode of said ninth transistor, said temperature-dependent current source further including eighth, ninth, and tenth resistors respectively connected between said first terminal of fixed potential and said emitter electrodes of said fourteenth, fifteenth, and sixteenth transistors, and third and fourth terminals respectively connected to said second terminal of fixed potential and said emitter electrode of said thirteenth transistor for externally connecting an eleventh resistor between said second terminal of fixed potential and said emitter electrode of said thirteenth transistor.

11. The multivibrator circuit of claim 10 further comprising start-up means for ensuring said temperature-dependent current source reaches a stable operating point when said multivibrator is initially powered, said start-up means including seventeenth and eighteenth transistors having a base electrode, an emitter electrode and a collector electrode, said base electrode of said seventeenth transistor connected to said base electrode of said fourteenth transistor, said collector electrode of said seventeenth transistor connected to said base electrode of said eighteenth transistor, and said emitter electrode of said eighteenth transistor connected to said second terminal of fixed potential, said start-up means further including twelfth and thirteenth resistors respectively connected between said first terminal of fixed potential and said emitter electrode of said seventeenth transistor and between said first terminal of fixed potential and said collector electrode of said eighteenth transistor and a seventh diode connected between the collector electrode of said eighteenth transistor and the commonly connected base and collector electrodes of said twelfth and thirteenth transistors.

12. An integrated circuit voltage-controlled oscillator comprising:

first, second, third, and fourth transistors, the collector electrodes of said first and second transistors respectively connected to the base electrodes of said third and fourth transistors, the base electrodes of said first and second transistors respectively connected to the emitter electrodes of said fourth and third transistors, the collector electrodes of said third and fourth transistors commonly connected to a firs terminal of fixed potential, and the emitter electrodes of said first and second transistors respectively connectable to the first and second terminals of a timing capacitor;

first, second, and third diodes serially connected between said first terminal of fixed potential and said collector electrode of said second transistor;

a fourth diode connected between the junction of said second and third diodes and said collector of said first transistor;

fifth and sixth diodes connected in an opposite-poled parallel configuration between said collectors of said first and second transistors;

a first NPN current mirror including first, second, third, and fourth current sources respectively connected to the emitter electrodes of said first, second, third, and fourth transistors, said first NPN current source responsive to the sum of a first control current and a second control current;

a first PNP current mirror including fifth and sixth current sources respectively connected to the collector electrodes of said first and second transistors, said first PNP current mirror responsive to a third control current;

a temperature-dependent current source for generating said first and third control currents such that said first and third control currents are directly proportional to the voltage developed across a semiconductor junction carrying a predetermined current; and a voltage-to-current converter connected to said first NPN current mirror for producing said second control current in response to an applied frequency control voltage singnal.

13. The integrated circuit voltage-controlled oscillator of claim 12 wherein said first NPN current mirror includes fifth and sixth transistors, said fifth transistor collector electrodes connected to said first terminal of a fixed potential, said fifth transistor emitter electrode connected to the base electrode of said sixth transistor, said fifth transistor base electrode connected to the collector electrode of said sixth transistor, the emitter of said sixth transistor connected to said second terminal of fixed potential by a first resistor, each of said first, second, third, and fourth current sources of said NPN current mirror including a transistor and a resistor, the base electrodes of each of said current source transistors connected to said commonly connected fifth transistor emitter electrode and sixth transistor base electrode, said resistors of said first, second, third, and fourth current sources respectively connected between said current source transistor emitter electrodes and a second terminal of fixed potential.

14. The integrated circit voltage-controlled oscillator of claim 13 wherein said PNP current mirror includes a seventh and eighth transistor, the collector electrode of said seventh transistor connected to said second terminal of fixed potential, the base electrode of said seventh transistor connected to the collector electrode of said eighth transistor, the emitter electrode of said seventh transistor connected to the base electrode of said eighth transistor, the emitter electrode of said eighth transistor connected to said first terminal of fixed potential by a second resistor, each of said fifth and sixth current sources of said first PNP current mirror including a transistor and a resistor, said resistor connected between the emitter electrode of said current source resistor and said first terminal of fixed potential, each base electrode of said current source transistors connected to said base terminal of said eighth transistor, the collector electrode of said current source transistor of said fifth current source connected to the collector of said first transistor, and the collector of said current source transistor of said sixth current source connected to the collector of said second transistor.

15. The integrated circuit voltage-controlled oscillator of claim 14 wherein said temperature-dependent current source includes a second PNP current mirror having a ninth and tenth transistor and seventh and eighth current sources, the base electrode of said ninth transistor connected to the collector electrode of said tenth transistor, the emitter electrode of said ninth transistor connected to the base electrode of said tenth transistor, a third resistor connected between the emitter electrode of said tenth transistor and said first terminal of fixed potential, each of said seventh and eighth current sources including a transistor and a resistor, said resistor connected between said first terminal of fixed potential and the emitter electrode of said current source transistor, each of the base electrodes of said current source transistors connected to said base electrode of said tenth transistor, said temperature-dependent current source further including eleventh and twelfth transistors, the emitter electrode of said eleventh transistor connected to the base electrode of said twelfth transistor, the collector electrodes of said eleventh and twelfth transistors commonly connected to the base electrode of said ninth transistor, the base electrode of said eleventh transistor connected to the collector electrode of said current source transistor of said eighth current source; a thirteenth transistor, the collector electrode of said thirteenth transistor connected to the base electrode of said eleventh transistor and the base electrode of said thirteenth transistor connected to the base electrode of said fifth transistor; a fourteenth transistor with the collector electrode thereof connected to the emitter electrode of said thirteenth transistor, the emitter electrode of said fourteenth transistor connected to said second terminal of fixed potential; a fifteenth transistor, the emitter electrode of said fifteenth transistor connected to the collector electrode of said ninth transistor, the base electrode of said fifteenth transistor connected to the base electrode of said fifth transistor; sixteenth and seventeenth transistors, the emitter electrode of said sixteenth transistor connected to the base electrode of said seventeenth transistor, the base electrode of said sixteenth transistor connected to the collector electrode of said fifteenth transistor, the emitter electrode of said seventeenth transistor connected to said second terminal of fixed potential, the collector electrode of said sixteenth transistor connected to the collector electrode of said seventeenth transistor; a fourth resistor connected between said commonly connected collector electrodes of said sixteenth and seventeenth transistors and said first terminal of fixed potential; a fifth resistor connected between the emitter electrode of said twelfth transistor and the base electrode of said fourteenth transistor, said base electrode of said fourteenth transistor connectable to said second terminal of fixed potential by a sixth resistor; a seventh diode connected between the commonly connected collector electrodes of said sixteenth and seventeenth transistors and the base electrode of said eleventh transistor; and an eighth diode connected between said base electrode of said fifth transistor and the collector electrode of said current source transistor of said seventh current source.

16. The intergrated circuit voltage-controlled oscillator of claim 15 wherein said second control current of said first PNP current mirror is provided by a ninth current source connected to said first NPN current mirror, said ninth current source including a current source transistor and a resistor, said resistor connected between said second terminal of fixed potential and the emitter electrode of said current source transistor, the collector electrode of said source transistor connected to the base electrode of said seventh transistor, and the base electrode of said current source transistor connected to the base electrode of said sixth transistor.

17. The integrated circuit voltage-controlled oscillator of claim 16 wherein the emitter areas of said fourteenth transistor and of said current source transistors of said first, second, seventh, and eighth current sources are scaled with respect to the emitter areas of said first and second transistors, said emitter area of said fourteenth transistor being substantially four times greater than said emitter areas of said first and second transistors, said emitter areas of said current source transistors of said first, second, seventh, and eighth current sources being substantially twice said emitter areas of said first and second transistors.

18. The integrated circuit voltage-controlled oscillator of claim 17 wherein said voltage-to-current converter includes eighteenth and nineteenth transistors, each having an active collector load circuit, the base electrodes of said eighteenth and nineteenth transistors respectively connected to first and second voltage control terminals, the emitter electrodes of said eighteenth and nineteenth transistors respectively connectable to the first and second terminals of a resistor for controlling the gain of said voltage-to-current converter, the collector of said nineteenth transistor connected to the base of said fifth transistor, said voltage-to-current converter further including a third PNP current mirror incuding tenth and eleventh current sources for establishing the emitter currents of said eighteenth and nineteenth transistors.

* * * * *

UNITED STATES PATENT AND TRADEMARK OFFICE

CERTIFICATE OF CORRECTION

PATENT NO. : 3,904,989

DATED : September 9, 1975

INVENTOR(S) : Robert R. Cordell

It is certified that error appears in the above-identified patent and that said Letters Patent are hereby corrected as shown below:

Column 1, line 8, cancel "current" and insert --multivibrator--; line 29, change "circuits" to --circuit--. Column 4, line 4, cancel "switches" and insert --at--. Column 9, line 43, change "form" to --from--. Column 18, line 68, before "source" insert --current--.

Signed and Sealed this

*tenth* Day of *February 1976*

[SEAL]

*Attest:*

RUTH C. MASON
*Attesting Officer*

C. MARSHALL DANN
*Commissioner of Patents and Trademarks*